United States Patent
Chen et al.

(10) Patent No.: US 9,546,762 B2
(45) Date of Patent: Jan. 17, 2017

(54) LED ASSEMBLY

(71) Applicants: HUGA OPTOTECH INC., Taichung (TW); Interlight Optotech Corporation, Taoyuan County (TW)

(72) Inventors: Tzer-Perng Chen, Taoyuan County (TW); Tzu-Chi Cheng, Taoyuan County (TW)

(73) Assignees: HUGA OPTOTECH INC., Taichung (TW); INTERLIGHT OPTOTECH CORPORATION, Yangmei, Taoyuan County (TW)

( * ) Notice: Subject to any disclaimer, the term of this patent is extended or adjusted under 35 U.S.C. 154(b) by 69 days.

(21) Appl. No.: 14/460,943

(22) Filed: Aug. 15, 2014

(65) Prior Publication Data

US 2015/0070871 A1 Mar. 12, 2015

(30) Foreign Application Priority Data

Sep. 11, 2013 (TW) .............................. 102132802 A

(51) Int. Cl.
*F21K 99/00* (2016.01)
*H01L 23/00* (2006.01)
*H01L 25/075* (2006.01)
*H01L 33/50* (2010.01)
*F21Y 101/00* (2016.01)

(52) U.S. Cl.
CPC .............. *F21K 9/175* (2013.01); *F21K 9/232* (2016.08); *F21K 9/27* (2016.08); *H01L 24/24* (2013.01); *H01L 25/0753* (2013.01); *F21Y 2101/00* (2013.01); *F21Y 2103/10* (2016.08); *F21Y 2115/10* (2016.08); *H01L 33/504* (2013.01); *H01L 2224/48091* (2013.01); *H01L 2224/48137* (2013.01); *H01L 2224/48464* (2013.01); *H01L 2224/49107* (2013.01); *H01L 2924/12041* (2013.01)

(58) Field of Classification Search
CPC .......... F21K 9/175; F21K 9/135; H01L 24/24; H01L 25/0753
See application file for complete search history.

(56) References Cited

U.S. PATENT DOCUMENTS

| | | | |
|---|---|---|---|
| 5,886,401 A * | 3/1999 | Liu | ........................ H01L 24/82 257/678 |
| 9,261,242 B2 | 2/2016 | Ge et al. | |
| 2013/0320363 A1 | 12/2013 | Pan et al. | |

* cited by examiner

*Primary Examiner* — Mary Ellen Bowman
(74) *Attorney, Agent, or Firm* — Muncy, Geissler, Olds & Lowe, P.C.

(57) ABSTRACT

Disclosed are LED assemblies and their applications. An example LED assembly has an LED chip, a supportive structure and a transparent structure. The LED chip includes a transparent substrate, at least one LED cell, and two pads. The transparent substrate has a top surface with two terminals. The LED cell is formed on the top surface, and includes at least one light-emitting stack configured to emit light. The pad is formed on the top surface at the two terminals. The supportive structure has a transparent portion and a conductive portion. The conductive portion is connected to the transparent portion to fix the LED chip and supply electric power to at least one of the pads. The transparent structure encapsulates the LED cell.

16 Claims, 7 Drawing Sheets

LED ASSEMBLY

CROSS-REFERENCE TO RELATED APPLICATION

This application claims priority to and the benefit of Taiwan Application Serial Number 102132802 filed on Sep. 11, 2013, which is incorporated by reference in its entirety.

BACKGROUND

The present disclosure relates generally to light emitting diode (LED) assemblies and their applications.

LED has been used in different kinds of appliances in our daily life, such as traffic lights, car headlights, street lamps, computer indicators, flash lights, LCD backlight modules, and so on. The LED chips are produced by semiconductor manufacturing process in the front end, and then undergo LED packaging in the back end to result in LED assemblies or apparatuses.

LED packaging mainly provides mechanical, electrical, thermal, and optical supports to LED chips. LED chips, which are a kind of semiconductor products, are prone to degradation, or aging, if being exposed for a long time in an atmosphere full of humidity or chemical. Design for packaging white LEDs needs to further consider color temperature, color rendering index, phosphor, etc. The white LED could be provided by phosphor converting a portion of the blue light from a blue LED chip into green/yellow light such that the mixture of the lights is perceived as white light by human eyes. Because human eyes are vulnerable to high-intensity blue light, the blue light from a blue LED chip in a white LED package should not emit outward directly without its intensity being attenuated by phosphor. LED lighting apparatuses nowadays are power-saving but costly; hardly to attract common consumers to replace conventional lighting apparatuses. In order to make LED products more competitive in the market, LED package manufactures constantly pursue advanced packaging processes which are more reliable, low-cost, and high-yield.

BRIEF DESCRIPTION OF THE DRAWINGS

Non-limiting and non-exhaustive embodiments of the present disclosure are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The disclosure can be more fully understood by the subsequent detailed description and examples with references made to the accompanying drawings, wherein.

DETAILED DESCRIPTION

An LED assembly 300a according to an embodiment of the disclosure is described in detail with reference to FIG. 1A, in which an LED chip 100 is fixed on a transparent submount 114 by way of flip chip technique, i.e. the LED chip 100 is upside down on the transparent submount 114. The transparent submount 114 could be ceramic, glass, sapphire, silicon carbide (SiC), or diamond-like carbon (DLC), for example. The transparent submount 114 has an oblong surface with a narrow width and a long length. At two ends of the long length on the oblong surface are formed two conductive electrode plates 110 and 112, respectively, which are electrically coupled to pads or bumps (not shown in FIG. 1A) on the LED chip 100. The pads or bumps act as the anode and the cathode of the LED chip 100. The conductive electrode plates 110 and 112 are transparent or opaque, and could be made of metal or transparent conductive material like indium tin oxide (ITO), for example. The transparent submount 114 allows the light emitted from the LED chip 100 to go therethrough, so that the LED chip 100 could shine the area under the middle section of the transparent submount 114 as the conductive electrode plates 110 and 112 are at the ends of the long length and hardly block the light beam. The transparent submount 114 is a supportive structure that supports and holds the LED chip 100. In another embodiment, the conductive electrode plates 110 and 112 could be formed at one common end on the oblong surface of the transparent submount 114.

Figure 1A:
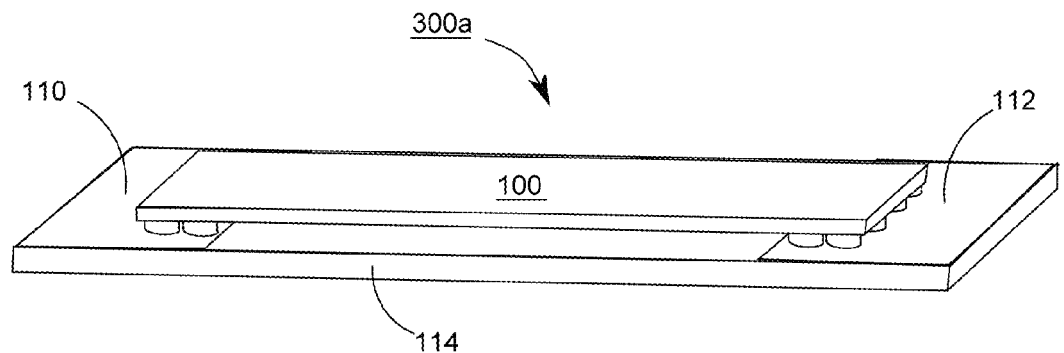
FIGS. 1A, 1B and 1C illustrate three LED assemblies according to embodiments of the disclosure.

In FIG. 1A, no obstacles substantially block the light emitted from the LED chip 100 in respect to any direction, such that the LED assembly 300a is an LED assembly emitting light with an omnidirectional light pattern.

The disclosure is not limited to use only flip chip technique to fix the LED chip 100 on the submount 114. In other embodiments, the LED chip 100 could have its bottom resting on the transparent submount 114, while conductive material such as silver paste or solder is used to glue the LED chip 100 and the transparent submount 114. As demonstrated by the LED assembly 300b in FIG. 1B, silver paste 116 on pads or bumps provides to the LED chip 100 not only mechanic support but also electrical connection to conductive electrode plates 110 and 112. The LED chip 100 in FIG. 1B has several LED cells (not shown) formed on its top, and the LED chip 100 might be positioned upright or upside down on the oblong surface of the transparent submount 114. In another embodiment demonstrated by the LED assembly 300c in FIG. 1C, bonding wires 118 or solder landing on pads/bumps of the LED chip 100 are used to electrically couple the pads or bumps of the LED chip 100 to conductive electrode plates 110 and 112.

In some embodiments, the LED chip 100 could be a white LED chip, in which are LED cells all emitting perceivable white light. In some other embodiments, the LED chip 100 has blue LED cells (emitting light with a dominant wavelength about 430 nm to 480 nm), green LED cells (emitting light with a dominant wavelength about 500 nm to 530 nm), red LED cells (emitting light with a dominant wavelength about 630 nm to 670 nm), or the combination thereof. The LED cells in the LED chip 100 are not necessary to be all of the same color. It might happen that some LED cells in the LED chip 100 emit light of one color, and others emit light of another.

Figure 1B:
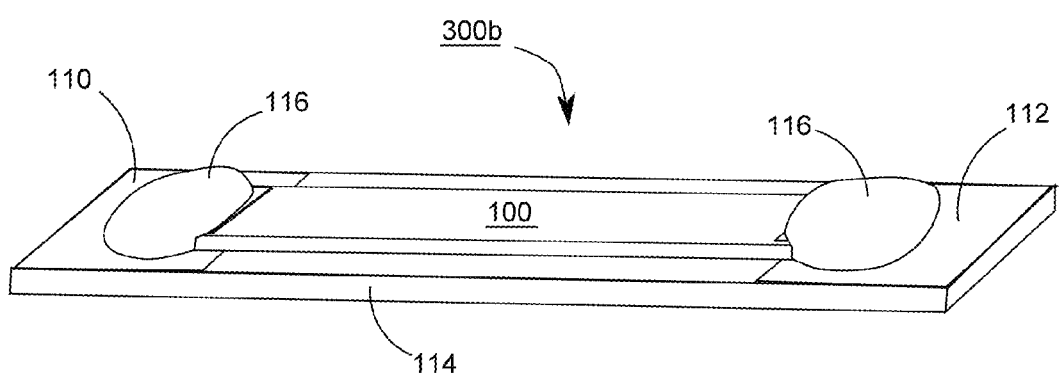
Figure 1C:
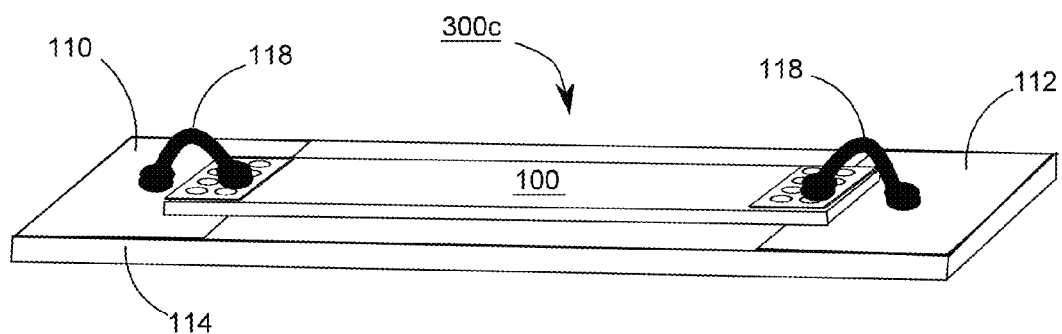
Figure 2:
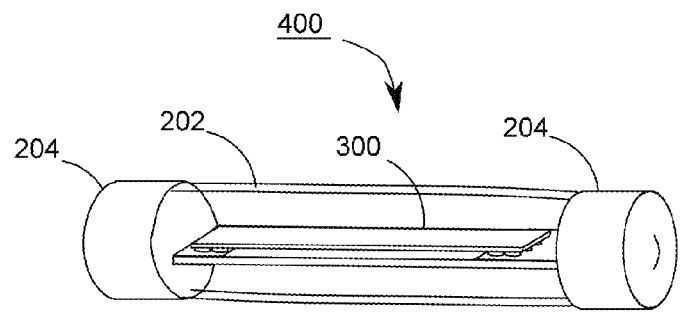
FIG. 2 demonstrates an LED lighting apparatus, whose filament could be anyone of the LED assemblies shown in FIGS. 1A to 1C.

FIG. 2 demonstrates an LED lighting apparatus 400, whose filament is an LED assembly 300, which could be anyone of those shown in FIGS. 1A to 1C. Simply speaking, a lamp shell 202 in the shape of a tube surrounds the LED assembly 300 and allows the light from the LED assembly 300 to go therethrough. Two conductive caps 204 (made of metal, for example) seal two opens at the ends of the lamp shell 202, provide electric connection to electrode plates 110 and 112, and also hold the LED assembly 300 inside an inner space substantially defined by the lamp shell 202. The conductive caps 204 have, in one embodiment, two pairs of metal jaws, for clamping and supplying power to the electrode plates 110 and 112 respectively. The lamp shell 202 and the conductive caps 204 are collectively a supportive structure that holds the LED assembly 300 inside the lamp shell 202, and an external power source or LED driver (not shown) can drive the LED chip 100 via the conductive caps 204, electrode plates 110 and 112. The lamp shell 202 could be glass or plastic, for example, which is transparent with respect to the light emitted from the LED assembly 300.

In one embodiment, the LED chip 100 in the LED lighting apparatus 400 is a blue or ultraviolet LED chip (emitting light with a dominant wavelength less than 430 nm), and the lamp shell 202 of the LED lighting apparatus 400 has a phosphor layer coated thereon to convert a portion of the light from the LED chip 100 into green yellow light or yellowish-green light. The phosphor could, by way of example, be coated over the interior or exterior surface of the lamp shell 202, or dispersed inside the body of the lamp shell 202.

Figure 3A:
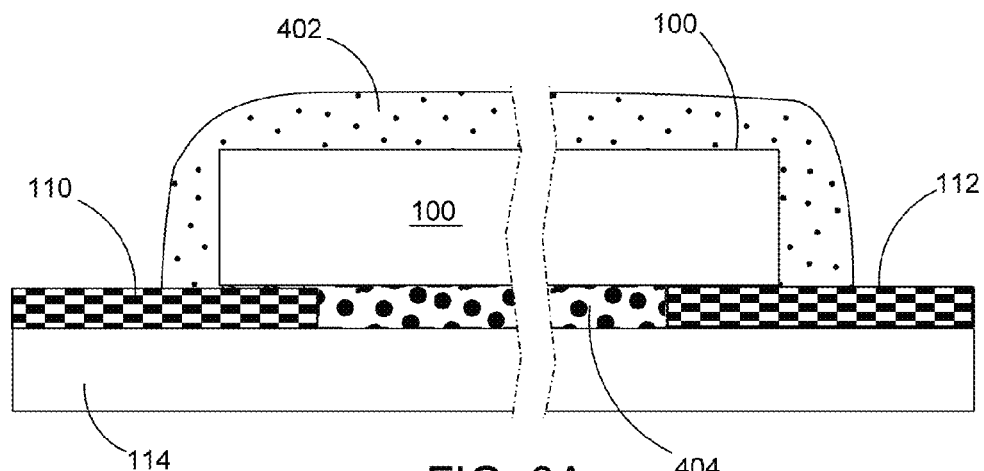
FIGS. 3A and 3B demonstrate the LED chip is substantially encapsulated by phosphor layers.
Figure 3B:
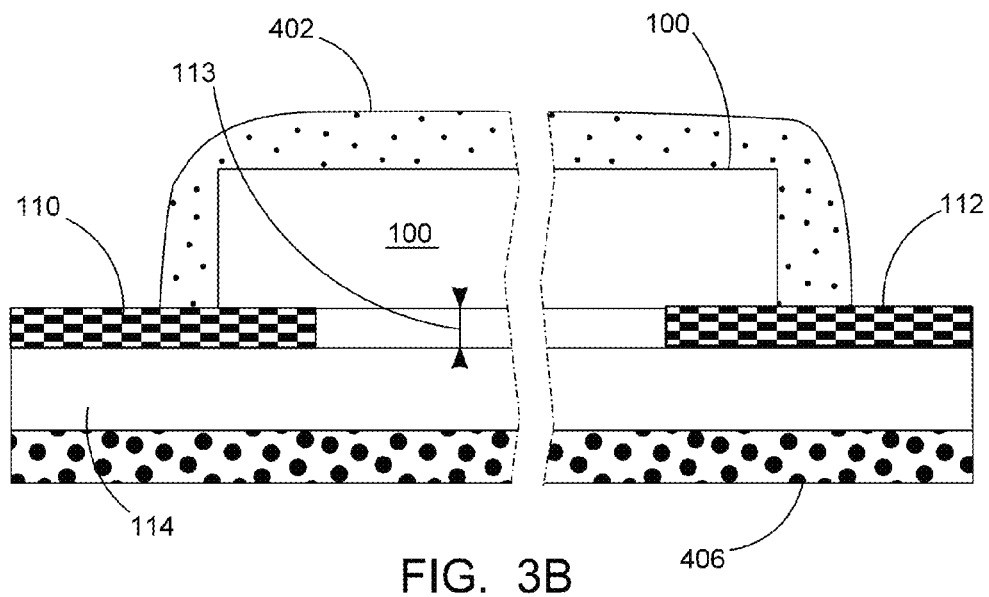

In one embodiment, the LED chip 100 has blue LED cells substantially encapsulated by one or more phosphor layers, as demonstrated in FIGS. 3A and 3B. In FIG. 3A, the LED chip 100 is fixed on the submount 114 by flip chip technique, i.e. the LED chip 100 is upside down to have bumps or pads (not shown) on its top surface contact with electrode plates 110 and 112. Between the LED chip 110 and the transparent submount 114 is a phosphor layer 404 while another phosphor layer 402 covers the LED chip 100. The phosphor layers 402 and 404 substantially form a capsule to encapsulate the LED chip 100, the blue or UV light from which inevitably experiences conversion, so that human eyes could avoid damage or stress caused by over high intensity of the blue or UV light. It is noted that the capsule is a transparent structure, but the LED chip 100 inside the capsule might be hardly or indistinctly seen because of the phosphor layers. In one embodiment, the phosphor layer 402 is transparent silicone resin with a plurality of phosphor particles dispersed therein, and is formed on the LED chip 100 by way of spraying, dispensing or screen printing. In FIG. 3B, the LED chip 100 is also fixed on the submount 114 by flip chip technique, but the gap 113 between the LED chip 100 and the submount 114 has no phosphor layer. The gap 113 might be void in one example, or be filled with transparent resin in another example. In FIG. 3B, a bottom surface of the transparent submount 114 is nevertheless coated with a phosphor layer 406, while the phosphor layer 402 covers the LED chip 100. In FIG. 3B, the phosphor layers 402 and 406 form a capsule to substantially encapsulate the LED chip 100. The interior of the lamp shell 202 in FIG. 2 might be vacuumed, or filled with some non-active gas, such as air, nitrogen, helium or argon, which doesn't degrade the performance of the LED chip 100 therein.

Figure 4A:
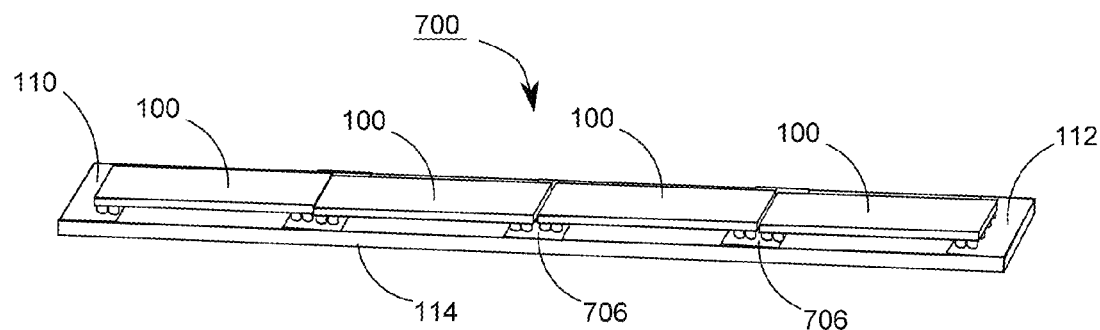
FIG. 4A shows another LED assembly with several LED chips.
Figure 4B:
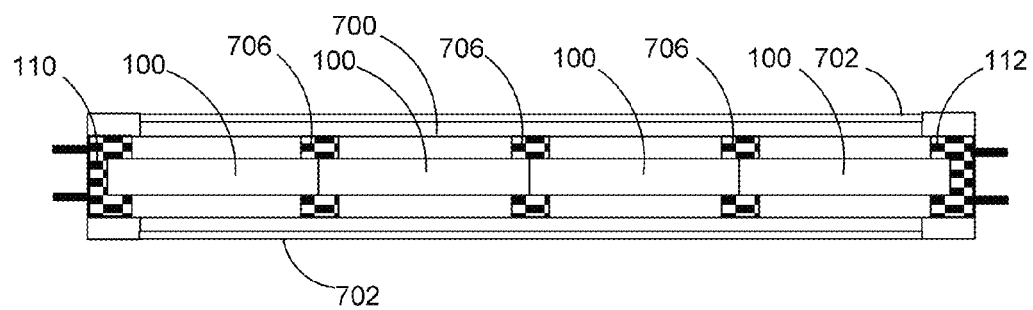
FIG. 4B shows a cross-sectional view of a lighting apparatus using the LED assembly in FIG. 4A as its filament.

This disclosure is not limited to having only one LED chip on a single submount, nevertheless. FIG. 4A shows an LED assembly 700, which is suitable to be a filament and has a submount 114 carrying several LED chips 100 thereon. The LED chips 100 are fixed on a common submount 114 by way of flip chip technique, and the submount 114 has additional conductive plates 706, each providing electric interconnection between two LED chips 100 adjacent to each other. The LED chips 100 in FIG. 4A are connected in series between electrode plates 112 and 110. A cross section from a top view of a lighting apparatus using the LED assembly 700 as its filament is shown in FIG. 4B. The lighting apparatus in FIG. 4B is in a form of tube with a transparent glass tube 702, which surrounds the LED assembly 700 carrying four LED chips 100.

Figure 5:
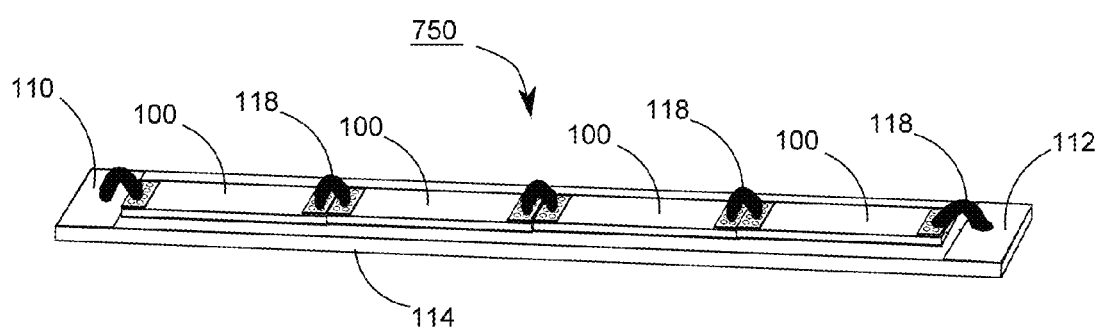
FIG. 5 is another LED assembly with several LED chips on a submount.

FIG. 5 is another LED assembly 750, which is suitable to be a filament and has several LED chips 100 on a submount 114. Four LED chips 100 are connected in series between electrode plates 112 and 110, and electric interconnection between two neighboring LED chips 100 is provided by one bonding wire 118. The bonding wires 118 in FIG. 5 could be replaced by lumps of solder in another embodiment.

Figure 6:
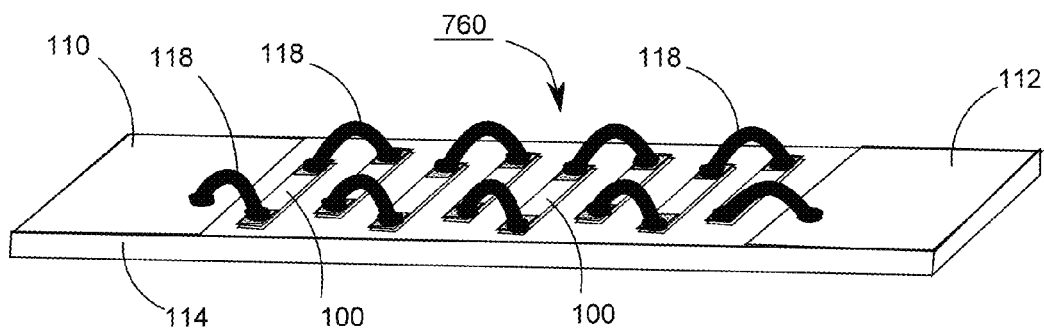
FIG. 6 demonstrates an LED assembly according to an embodiment of the disclosure.
Figure 7A:
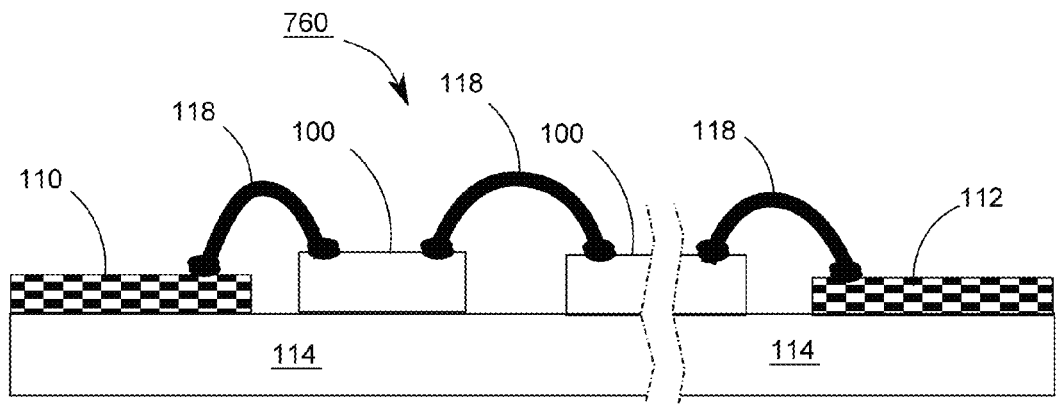
FIG. 7A shows an illustrative cross sectional view of an LED assembly.
Figure 7B:
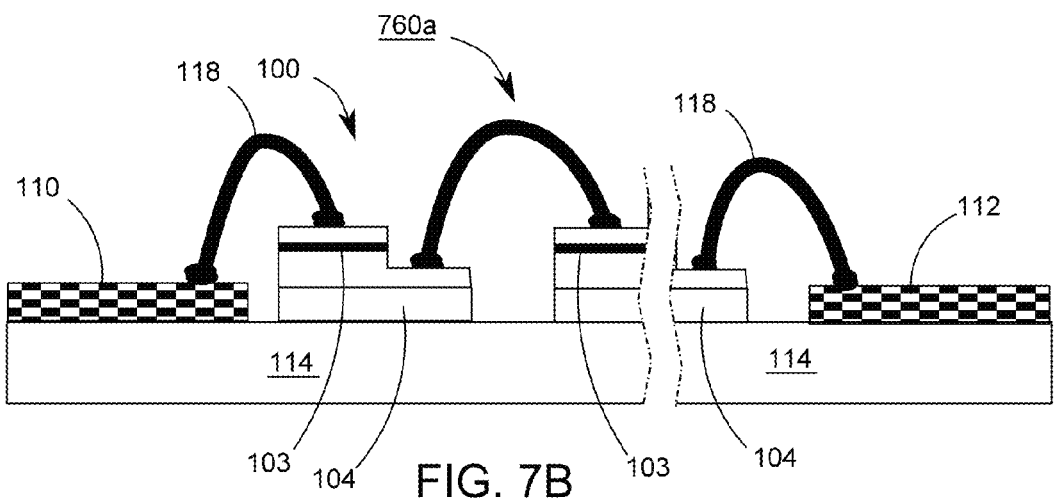
FIG. 7B shows another an illustrative cross sectional view of an LED assembly, which exemplifies the LED assembly in FIG. 7A.

The present disclosure is not limited to the pattern according to which the LED chips 100 are arranged on the submount 114 in FIGS. 4A, 4B and 5, where the anode and the cathode of each LED chip 100 are placed on a straight line parallel to the long length of the submount 114. FIG. 6 demonstrates an LED assembly 760 according to an embodiment of the disclosure, where each LED chip 100 has its anode and cathode on a straight line substantially perpendicular to the long length of the submount 114. FIG. 7A shows a cross sectional view of the LED assembly 760, which is suitable to be a filament in a lamp. FIG. 7A mainly shows how the LED chips are connected in series by the bonding wires 118 between the electrode plates 112 and 110. Demonstrated in FIGS. 6 and 7A are LED chips 100 connected to each other by bonding wires 118 and mounted on the submount 114. FIG. 7B shows another cross sectional view of an LED assembly 760a, which exemplifies the LED assembly 760. In the LED assembly 760a, each LED chip 100 has only one LED cell formed by way of semiconductor manufacturing processes on a transparent substrate 104. The LED cell has a lighting-emitting stack 103 including, but not being limited to, an n-type semiconductor film, a p-type semiconductor film, and an active film that emits light and is laminated between the n-type and p-type semiconductor films. Each LED chip 100 has pads (not shown in FIG. 7B) on which a bonding wire 118 could attach for electric interconnection. In FIG. 7B, the bonding wires 118 provide electric interconnection not only between two neighboring LED chips 100 but also between one LED chip 100 and an electrode plate (112 or 110). The transparent substrate 104 could be a crystalline substrate for epitaxially growing the lighting-emitting stack 103, or a carrier substrate on which the lighting-emitting stack 103 is bonded. In another embodiment, formed in each LED chip 100 are patterned metal layers for interconnection between LED cells.

Figure 8:
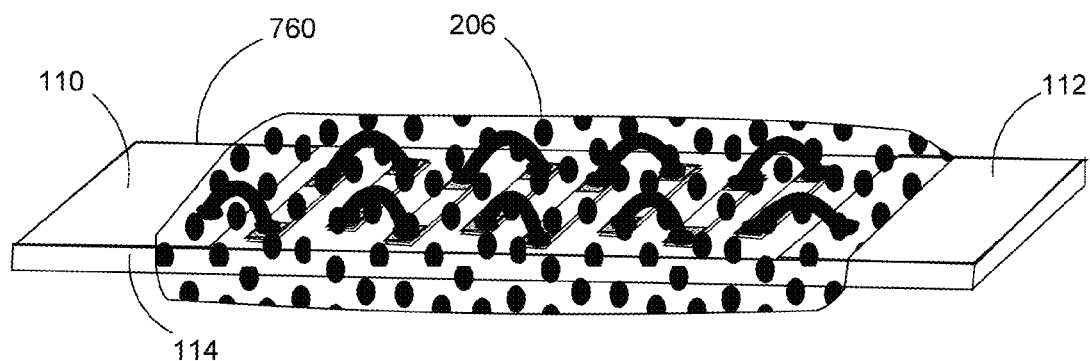
FIG. 8 demonstrates an LED assembly with a phosphor layer covering all LED chips.

In one embodiment of FIG. 8, the LED chips 100 in the LED assembly 760 all emit blue light, and a phosphor layer 206 covers and surrounds all the LED chips 100 and the bonding wires 118. The phosphor layer 206 not only converts the blue light into light with a different color (such as yellow, yellowish green or green), but also provides light scattering, and further protects the LED chips 100 and the bonding wires 118 from possible damage caused by atmosphere or humidity. The phosphor layer 206 in FIG. 8 could be a transparent resin or silicone with a plurality of phosphor particles dispersed therein. The phosphor particles could include, but is not limited to, a material such as aluminum oxide (yttrium aluminum garnet (YAG) or terbium aluminum garnet (TAG)), silicate, vanadate, alkaline earth selenide, metallic nitride, alkaline earth sulfides, metallic nitrogen oxide, a mixture of tungstate and molybdate, etc. Molding or Casting, a process using a liquid or gel material to solidify in a mold, could be used to form the phosphor layer 206 covering or surrounding the LED chips 100 and the bonding wires 118, but leaving the electrode plates 110 and 112 exposed for further electric contact. The phosphor layer 206 forms a kind of capsule that encapsulates all the LED chips 100 and the bonding wires 118. The phosphor layer 206 provides a transparent structure, but the LED chip 100 inside the capsule might be hardly or indistinctly seen because of the phosphor. In another embodiment, a transparent resin layer without phosphor is first formed by casting to encapsulate the LED chips 100 and bonding wires 118, and an additional phosphor coat is then formed over the transparent resin layer by casting or spraying.

Figure 9:
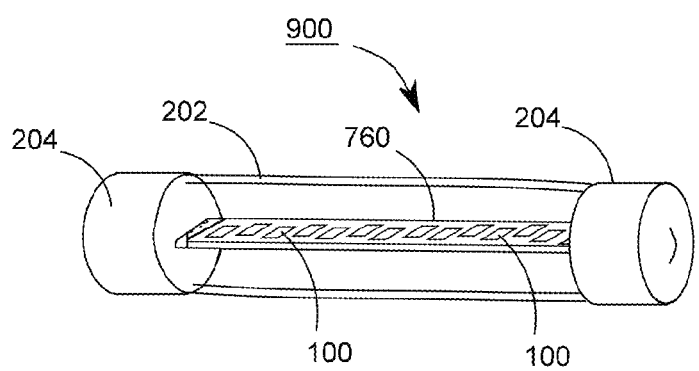
FIG. 9 demonstrates an LED lighting apparatus.

FIG. 9 demonstrates an LED lighting apparatus 900, which uses the LED assembly 760 in FIG. 8 as its filament, which could be replaced by any one of the aforementioned LED assemblies in other embodiments. According to the teaching related to the LED apparatus 400 in FIG. 2, the LED lighting apparatus 900 is self-explanatory, and its detail is omitted herein for brevity.

Figure 10:
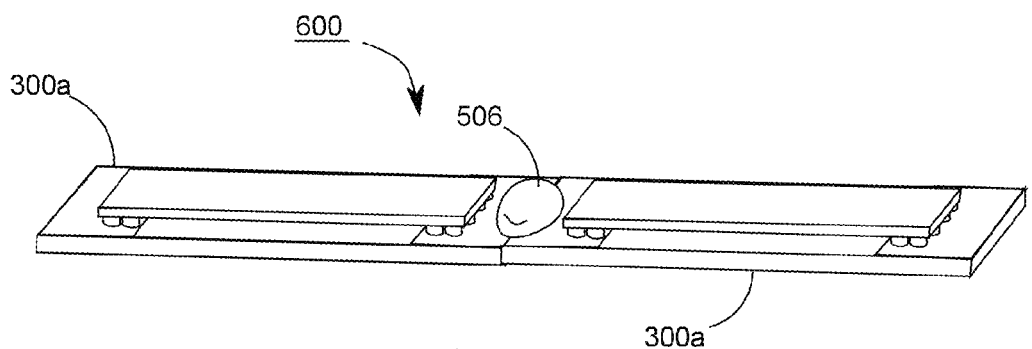
FIG. 10 demonstrates a filament with two LED assemblies connected in series.

A lighting apparatus according to the disclosure could employ more than one LED assembly as its filament. FIG. 10 demonstrates a filament 600 with two LED assemblies 300a connected in series that in one embodiment could replace the filament in FIG. 2. An electrically conductive adhesive 506, such as silver paste or solder, not only glues the two LED assemblies 300a, but also provides electric connection from one electrode plate of one LED assembly 300a to one electrode plate of the other.

Figure 11:
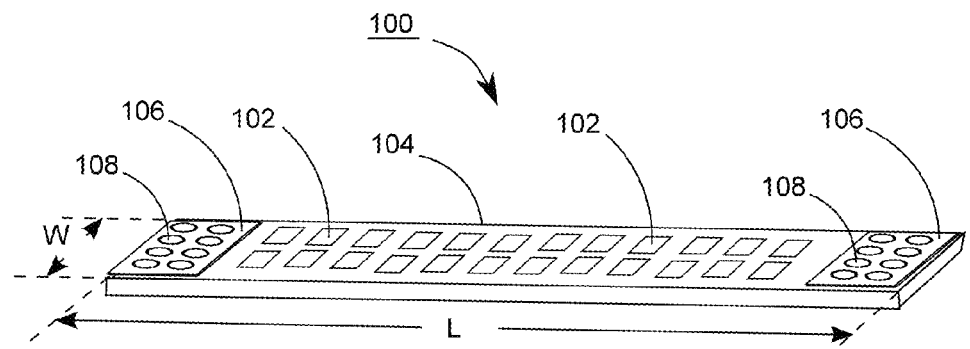
FIG. 11 demonstrates an LED chip.
Figure 12:
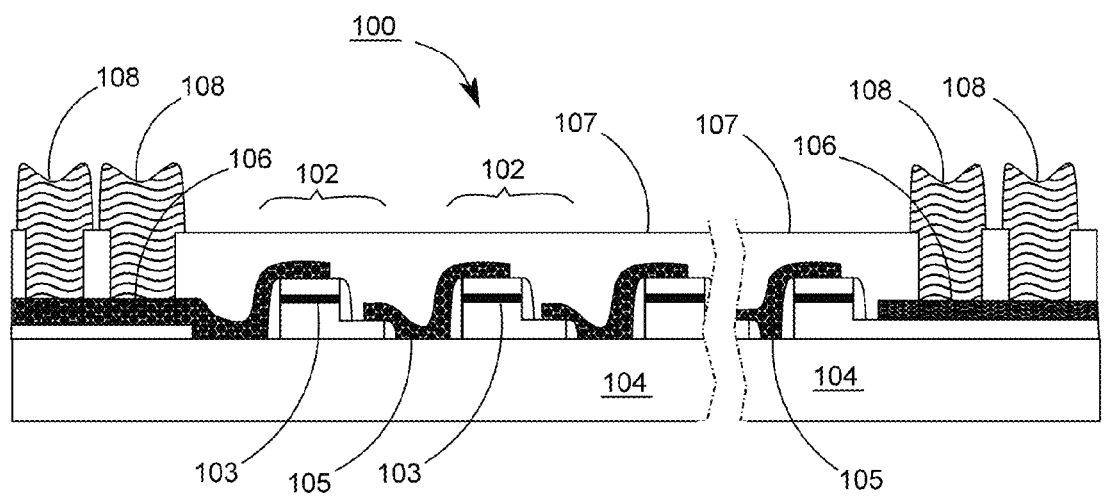
FIG. 12 shows a possible cross-sectional view of the LED chip in FIG. 11.

FIG. 11 demonstrates an LED chip 100, which could be used as a light source in several LED assemblies according to embodiments of the disclosure. Formed on a top surface of the LED chip 100 are LED cells 102, pads 106, and bumps 108. A possible cross-sectional view of the LED chip 100 in FIG. 11 is shown in FIG. 12. In this specification, the LED chip 100 refers to as one of the chips or dies produced by singulating a wafer that has experienced semiconductor manufacture processes, such as epitaxy, lithography, deposition, oxidation, etching, metallization, and so on, to form simultaneously lots of LED cells thereon, where each LED cell has a lighting-emitting stack 103 including, but not being limited to, an n-type semiconductor film, a p-type semiconductor film, and an active film which emits light and is laminated between the n-type and p-type semiconductor films. Like that shown in FIG. 7B, an LED chip might have only one LED cell. In some embodiments, an LED chip has several LED cells connected in series, in parallel, or in a network with both series and parallel connections.

As shown in FIGS. 11 and 12, the LED cells 102, each having a lighting-emitting stack 103, are formed on a top surface of a transparent substrate 104 in the LED chip 100. Metal layers 105, each providing electric connection from one LED cell 102 to another, are also formed on the top surface by way of semiconductor manufacturing processes. That top surface might be an oblong rectangle with a length L and a width W, as denoted in FIG. 11. In one embodiment L is 440 mil and W is 10 mil; meaning a length-to-width ratio of 44. Two pads 106 are respectively formed at the two terminals (along the length) of the oblong rectangle, wherein one of the pads 106 shown in FIG. 12 extends above one lighting-emitting stack 103, and the other is formed on a recession of another lighting-emitting stack 103. In FIG. 12, a passivation 107 protects LED cells 102, and has several openings over the pads 106, in which the bumps 108 such as solder or golden bumps are formed, such that the LED chip 100 in FIG. 12 can be flipped over to have the bumps 108 fixed on and contacted to a submount, as exemplified in FIGS. 1A, 3A and 3B. In another embodiment, the passivation 107 has only two openings respectively formed over each pad 106 of one LED chip 100 and the openings are not filled with anything, and therefore, a bonding wire can land on the opening to provide electrical contact to the pad 106. The pads 106 could, but is not limited to, be a portion of the metal film that is patterned to form the metal layers 105. In another embodiment, the pads 106 are made from a material different from that of the metal layers 105.

Even though in FIGS. 2, 4B, 5, 6, a submount 114 is provided to carry one or more LED chips 100 for the use of a filament in a lighting apparatus, embodiments of the disclosure are not limited to.

Figure 13:
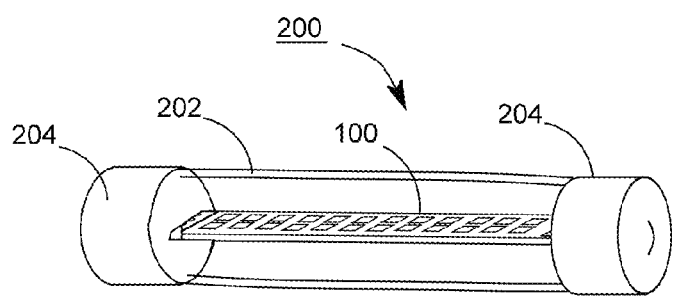
FIG. 13 shows an LED lighting apparatus having a lamp shell and using an LED chip alone as its filament.

In one embodiment, an LED chip 100 preferably has a length more than 1 millimeter, such as 5, 10, 20, 30, 40 millimeters and its length-to-width ratio is more than 10. As its length is more than 1 millimeter and there are two pads 106 at two terminals along its length, respectively, the LED chip 100 alone without a submount could be a filament, to simplify and cost down the manufacture process for making an LED lighting apparatus. FIG. 13 shows an LED lighting apparatus 200 having a lamp shell 202 and using an LED chip 100 alone as its filament. The LED chip 100 is inserted inside the lamp shell 202, while two conductive caps 204 contact the pads 106 or the bumps 108 (shown in FIG. 12). As the lamp shell 202 is a tube in shape, it covers not only the bottom side of the LED chip 100, but also the lateral and top sides of the LED chip 100. The similarity between FIGS. 13 and 2 can be derived or understood in view of the teaching to FIG. 2, and its detail is omitted herein for brevity. Unlike FIG. 2, whose filament has a submount 114 carrying an LED chip 100, FIG. 13 has no submount and uses only an LED chip 100 as its filament.

Figure 14:
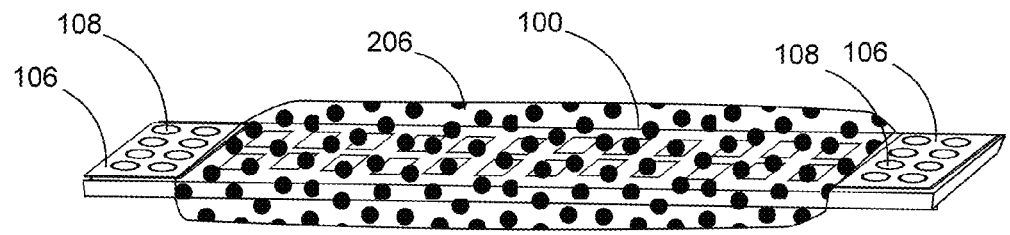
FIG. 14 demonstrates an LED chip with LED cells surrounded or encapsulated by a phosphor layer.

In one embodiment, the lamp shell 202 in FIG. 13 has phosphor for converting blue or UV light into green, yellowish green, or yellow light, and making the LED lighting apparatus 200 perceivably emit white light. Phosphor might coat over the internal or external surface of the lamp shell 202, or alternatively is dispersed inside the body of the lamp shell 202. In another embodiment, all the LED cells 102 inside the LED chip 100 are blue or UV LED cells, and they are surrounded or encapsulated by a phosphor layer 206, which, as demonstrated in FIG. 14, forms a capsule covering the top and bottom sides of the LED chip 100. As the blue light emitted from the LED cells must confront the phosphor in the phosphor layer 206 or the lamp shell 202, the concern of blue light leakage could be avoided or alleviated. In one embodiment, the phosphor layer 206 is formed by casting, and becomes as a capsule to substantially encapsulate all the LED cells 102 on the LED chip 100, but to leave the bumps 108 or the pads 106 of the LED chip 100 (of FIG. 12) exposed for further electric connection. In another embodiment, a transparent resin layer without phosphor is first formed by casting to encapsulate the LED cells 102, and an additional phosphor layer is then formed over the transparent resin layer by casting or spraying.

Since no obstacle substantially blocks the light emitted from the LED chip 100, in view from the top, bottom, left, right, front, or back direction, the LED chip 100 alone could be a filament that emits light with an omnidirectional light field.

Figure 15:
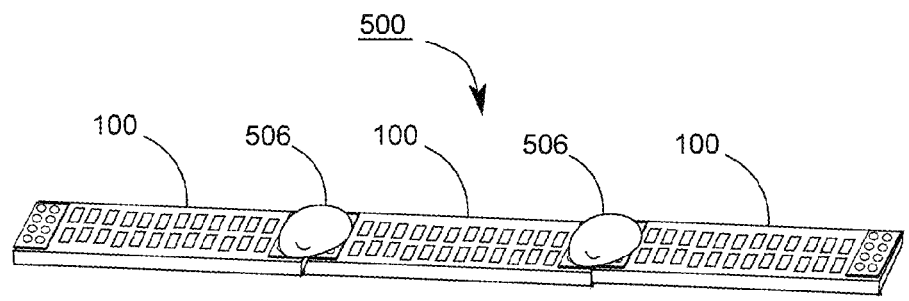
FIG. 15 illustrates a filament capable of replacing the filament in FIG. 13.

A filament according to the embodiments of the disclosure could have several LED chips connected in series or in parallel. FIG. 15 illustrates a filament 500 capable of replacing the filament in FIG. 13. The filament 500 has three LED chips 100 connected in series, and one pad in an LED chip 100 is electrically connected to one pad in another LED chip 100 by the conductive adhesive 506, such as silver paste or solder.

Figure 16:
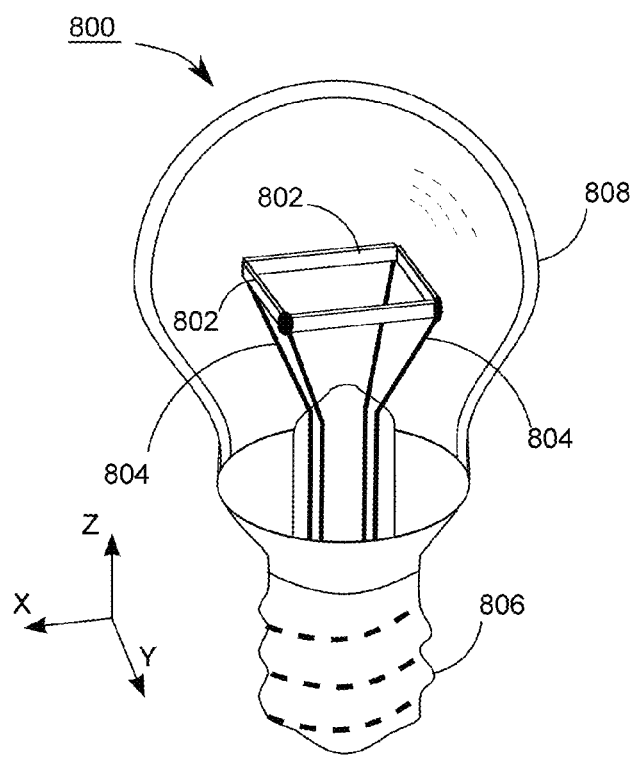
FIG. 16 shows a light bulb.

FIG. 16 shows a light bulb 800, which employs filaments 802 according to the embodiments of the disclosure. Each filament 802 might be anyone of the aforementioned filaments, with or without a submount. For example, the filament 802 could be the filament in FIG. 14, or the filament in FIG. 8. The light bulb 800 includes an Edison screw base 806, a transparent or semitransparent lamp bulb 808, conductive pillars 804 and the filaments 802. The Edison screw base 806 is capable of screwing into a matching socket and could be equipped with an LED driving circuit therein (not shown). The lamp bulb 808 is fixed on the Edison screw base 806, and an inner space refers to the space enclosed by the lamp bulb 808 and the Edison screw base 806. The conductive pillars 804 and the filaments 802 are all fixed inside the inner space while the four conductive pillars 804 extended from the Edison screw base 806 support and hold the filaments 802. The conductive pillars 804 provide to the filaments 802 not only mechanical support but also electric power. Each conductive pillar 804 might be made of metal, and has a solder joint at its apex to glue or fix two filaments 802 thereon. The conductive pillars 804 might make the filaments 802 electrically connected in a parallel, series, or bridge configuration. The filaments 802 are coplanar, positioned in the same plane that is perpendicular to the screw axis of the Edison screw base 806, the Z direction. Therefore, the light bulb 800 could be an omnidirectional LED lighting apparatus.

Embodiments of this disclosure use an LED chip alone as a filament because the LED chip has a large length or a high length-to-width ratio, so as to cost down the LED packaging process. Some embodiments employ flip chip technique or means such as silver paste or solder instead of the conventional costly wire bonding process to fix an LED chip on a submount, which probably results in a cheaper LED packaging process. This disclosure is not limited to not using wire bonding, though. As demonstrated, some embodiments use bonding wires for interconnection between LED chips. All the aforementioned embodiments can have an omnidirectional light pattern and could be used as filaments for omnidirectional lighting apparatuses.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode assembly, comprising:
    an LED chip, comprising:
        a transparent substrate having a top surface with two terminals;
        an LED cell formed on the top surface, wherein the LED cell includes at least one light-emitting stack configured to emit light; and
        two pads, formed on the top surface at the two terminals;
    a supportive structure, comprising:
        a transparent portion, transparent in view of the light emitted from the at least one light-emitting stack, and comprising a lamp shell in the shape of a tube with two opens; and
        a conductive portion, connected to the transparent portion, for fixing the LED chip and supplying electric power to one of the pads, and comprising two conductive caps sealing the two opens and fixing the LED chip inside the lamp shell; and
    a transparent structure, encapsulating the LED cell.

2. The light emitting diode assembly as claimed in claim 1, further comprising a transparent submount with an oblong surface having two ends, two electrode plates formed on the oblong surface at the two ends respectively, and the LED chip is fixed on the oblong surface and electrically coupled to the electrode plates.

3. The light emitting diode assembly as claimed in claim 2, wherein the LED chip is fixed on the oblong surface by way of flip chip technique.

4. The light emitting diode assembly as claimed in claim 2, wherein the LED chip is coupled to the electrode plates using bonding wires.

5. The light emitting diode assembly as claimed in claim 2, wherein the LED chip is coupled to the electrode plates using silver paste.

6. The light emitting diode assembly as claimed in claim 2, wherein the transparent structure includes a phosphor layer covering the LED chip and exposing the electrode plates.

7. The light emitting diode assembly as claimed in claim 1, wherein the transparent portion has a phosphor layer.

8. The light emitting diode assembly as claimed in claim 1, wherein the transparent structure has first and second phosphor layers, the first phosphor layer covers the LED chip, and the second phosphor layer is positioned between the LED chip and the supportive structure.

9. The light emitting diode assembly as claimed in claim 1, wherein the transparent structure has first and second phosphor layers, the first phosphor layer covers the LED chip, and the supportive structure is between the second phosphor layer and the LED chip.

10. The light emitting diode assembly as claimed in claim 1, wherein the transparent structure encapsulates the LED cell and exposes the pads.

11. The light emitting diode assembly as claimed in claim 1, further comprising a transparent submount with an oblong surface, the light emitting diode assembly comprises several LED chips fixed on the oblong surface and electrically connected in series.

12. The light emitting diode assembly as claimed in claim 11, wherein the LED chips are connected to each other by bonding wires.

13. The light emitting diode assembly as claimed in claim 11, wherein the LED chips fixed on the transparent submount by flip chip technique.

14. The light emitting diode assembly as claimed in claim 1, further comprising a solder or golden bump formed on each pad.

15. The light emitting diode assembly as claimed in claim 1, wherein the top surface has a length longer than 1 mm.

16. The light emitting diode assembly as claimed in claim 1, wherein the top surface has a length-to-width ratio more than 10.

* * * * *